United States Patent [19]

Pryor et al.

[11] Patent Number: 4,821,151

[45] Date of Patent: Apr. 11, 1989

[54] HERMETICALLY SEALED PACKAGE

[75] Inventors: Michael J. Pryor, Woodbridge; Narendra N. Singhdeo, New Haven; Deepak Mahulikar, Meriden, all of Conn.

[73] Assignee: Olin Corporation, New Haven, Conn.

[21] Appl. No.: 811,911

[22] Filed: Dec. 20, 1985

[51] Int. Cl.[4] .............................................. H05K 7/10
[52] U.S. Cl. .................................... 361/403; 174/52.4
[58] Field of Search ............................. 361/395, 403; 174/52 FP; 257/72, 73, 80

[56] References Cited

U.S. PATENT DOCUMENTS

| | | | |
|---|---|---|---|
| 3,676,292 | 7/1972 | Pryor et al. | 174/50.56 X |
| 4,225,900 | 9/1980 | Ciccio et al. | 361/403 X |
| 4,301,324 | 11/1981 | Kumar et al. | 174/68.5 |
| 4,313,026 | 1/1982 | Yamada et al. | 174/68.5 |
| 4,320,438 | 3/1982 | Ibrahim et al. | 174/52 FP X |
| 4,385,202 | 5/1983 | Spinelli et al. | 174/68.5 X |
| 4,410,927 | 10/1983 | Butt | 361/403 X |
| 4,491,622 | 1/1985 | Butt | 174/68.5 X |
| 4,513,355 | 4/1985 | Schroeder | 361/403 |
| 4,622,433 | 11/1986 | Frampton | 174/52 FP |

FOREIGN PATENT DOCUMENTS 1232621 5/1971 United Kingdom .
1349671 4/1974 United Kingdom .

OTHER PUBLICATIONS

"The Direct Bonding of Metals to Ceramics by the Gas-Metal Eutectic Method", by Burgess et al., published in *J. Electrochemical Society: Solid-State Science and Technology*, May 1975.

"Packaging", by Jerry Lyman in *Electronics*, vol. 54, No. 26, Dec. 1981.

"Solder Glass Processing", by SinghDeo and Shukla, in *Glass Science and Technology*, vol. 2, Academic Press, 1984.

*Primary Examiner*—Roy N. Envall, Jr.
*Assistant Examiner*—Derek S. Jennings
*Attorney, Agent, or Firm*—Gregory S. Rosenblatt; Paul Weinstein

[57] ABSTRACT

A hermetically sealed package adapted to house a plurality of semiconductor devices. The package include a multi-layer circuit device formed of a plurality of ceramic substrates and conductive circuit patterns disposed therebetween. A ceramic cover having at least one cavity adapted for receiving a semiconductor die is sealed to the multi-layer circuit device. Electrical leads are connected to the semiconductor device and extend outward from the package for connection to the conductive circuit pattern within the multi-layer circuit.

39 Claims, 1 Drawing Sheet

HERMETICALLY SEALED PACKAGE

This application is related to U.S. patent application Ser. No. 413,046 entitled "Multi-Layer Circuitry" by Sheldon H. Butt, filed Aug. 30, 1982; U.S. patent application Ser. No. 651,984 entitled "Sealing Glass Composite" by Edward F. Smith, III, filed Sept. 19, 1984; U.S. patent application Ser. No. 651,987 entitled "Sealing Glass Composite" by Edward F. Smith, III et al., filed Sept. 19, 1984; U.S. patent application Ser. No. 707,636, entitled "Pin Grid Arrays" by Michael J. Pryor, filed Mar. 4, 1985; U.S. patent application Ser. No. 811,908 (now abandoned) entitled "Steel Substrate with Bonded Foil" by Richard A. Eppler, filed Dec. 20, 1985; U.S. Pat. No. 4,712,161 entitled "Hybrid and Multi-Layer Circuitry", by Michael J. Pryor et al., issued Dec. 8, 1987; U.S. patent application Ser. No. 811,846, entitled "Metal-Glass Laminate" by Charles J. Leedecke et al. filed Dec. 20, 1985; U.S. patent application Ser. No. 811,910 entitled "A Method of Joining Metallic Components" by Michael J. Pryor et al., filed Dec. 20, 1985; U.S. Pat. No. 4,696,851, entitled "Hybrid and Multi-Layer Circuitry" by Michael J., Pryor, issued Sept. 29, 1987; U.S. patent application Ser. No. 811,906, entitled "Multi-Layer and Pin Grid Circuit Arrays" by Michael J. Pryor, filed, Dec. 20, 1985; and U.S. Pat. No. 4,491,622 entitled "Composites of Glass-Ceramic to Metal Seals and Method of Making the Same" by Sheldon H. Butt, issued Jan. Jan. 1, 1985.

While the invention is subject to a wide range of applications, it is particularly suited for a hermetically sealed package housing a plurality of semiconductor devices and will be particularly described in that connection. In particular, the semiconductor package includes a multi-layer circuit device bonded to a cover having a plurality of semiconductor devices hermetically sealed therein. The semiconductor devices are connected to the electrical circuitry within the multi-layer circuit device.

The present invention more specifically relates to pin grid arrays which are specific examples of multi-layer circuits. Pin grid arrays are typically small, multi-layer 96% alumina boards with conductive circuitry between the layers. The pin grid array minimizes the size required for large integrated circuits and permits the use of higher pin counts than possible with conventional quad packs. This package design provides rugged, reliable, hermetic packages and is preferable to CERDIPs because it is not dependent on glass encapsulation of the leads.

Conventional pin grid arrays typically contain at least three layers of alumina made by the tape cast process. The interlayer circuitry is fabricated with tungsten or moly-manganese powder silk screened onto a green alumina tape (96% $Al_2O_3$). The interconnects between the interlayer circuitry are provided through approximately about 5-10 mil holes punched in the green alumina tape. The interconnect or through-hole conductors are also formed with tungsten or moly-manganese powder. The multi-layer alumina tapes and conductor paths are cofired in the region of about 1550°-1600° C. This expels the polymeric binder from the alumina tape, sinters the 96% $Al_2O_3$ and produces partial sintering of the current carriers. The exposed conductors may then be coated with nickel by an electroless process. Thereafter, gold plated lead pins are brazed to the through-hole conductors.

There are a number of costly, technical problems in manufacturing pin grid arrays using the foregoing technology. The most serious technical problem is the very large volume contraction of the alumina tape when it is fired at high temperatures. The volume contraction can be as much as 60% and results in a linear contraction of almost 20%. This causes severe problems in the location of the through-holes relative to the pins and also in maintaining through-hole electrical contact. In some cases, the contraction is so high that the conductive transverse circuitry misses the pin altogether. The conventional means of silk screening the interlayer circuitry on the alumina tape results in circuitry which is relatively dense and well sintered. However, the through-hole contact, which may be inserted mechanically, can be very loose and provide only low frequency particle to particle contact.

There have been ongoing attempts to replace the conductor powders with copper foil. One advantage to this substitution would be the ability to form more precise circuitry using dry film photoresist and conventional printed circuit board etching techniques. Dry film photoresist and conventional printed circuit board etching are excellent techniques to produce accurate, reproducible and comparatively fine line circuitry on a copper layer bonded to a ceramic substrate. For example, 3 mil line widths on 3 mil spacings are relatively easy to generate using the above mentioned techniques.

Up until now, attempts to bond copper foil to alumina with glass under reducing conditions have invariably resulted in extensive blistering of the foil. This is due in part to the common use of CDA 11000 foil which contains cuprous oxide as a separate phase. When fired in a reducing atmosphere, the cuprous oxide in the alloy CDA 11000 is reduced and steam blistering results. It is also thought that blistering partially results from air entrapment in the glass due to the lack of a significant avenue of escape during the firing cycle. Blistering is particularly detrimental for multi-layer circuitry because it creates a weak bond between the ceramic substrate and the copper foil which can lead to delamination. Also, during the etching process, the etching solutions can seep into a blister, at the glass to foil interface, and etch the foil at an undesirable location.

In an attempt to eliminate the problem of blistering, bonding under oxidizing conditions has been attempted as disclosed in a paper entitled "The Direct Bonding of Metals to Ceramics by the Gas-Metal Eutectic Method" by Burgess et al., published in *J. Electrochemical Society: SOLID-STATE SCIENCE AND TECHNOLOGY,* May, 1975. This technique has attempted to take advantage of the high temperature cuprous oxide formed on the foil. Although this approach produced good bonds without blistering, it formed a high temperature cuprous oxide film on the outer surface of the foil; this film is extremely difficult to remove.

In the past, glass-ceramic structures with circuit patterns embedded therein were disclosed in U.S. Pat. No. 4,385,202 to Spinelli et al.; U.S. Pat. No. 4,301,324 to Kumar et al.; U.S. Pat. No. 4,313,026 to Yamada et al.; British Pat. No. 1,232,621 and British Pat. No. 1,349,671. Each of these patents specifically differs from the present invention in that they fail to teach or suggest, the bonding of a deoxidized or oxygen free copper or copper alloy foil to a ceramic substrate with a relatively high temperature sealing glass.

Multi-layered alumina circuit boards, whose layers are formed with the process of the present invention, are particularly useful as pin-grid arrays of the general type disclosed in the article entitled "Packaging" by Jerry Lyman, *Electronics*, Vol. 54, No. 26, Dec. 29, 1981.

Typically, a pin grid array has a single chip connected therein as shown in U.S. Pat. No. 4,513,355 to Schroeder et al. The intricate circuitry and required pin density were not usually achievable with the sintered powder approach to forming circuitry as disclosed in the prior art.

It is a problem underlying the present invention to provide a hermetically sealed package and process of forming the package wherein a pin grid array combined with a plurality of semiconductor chips can manage the thermal requirements of the package and provide the necessary pin density.

It is an advantage of the present invention to provide a hermetically sealed package and process of forming the package which obviates one or more of the limitations and disadvantages of the described prior processes and arrangements.

It is a further advantage of the present invention to provide a hermetically sealed package and process of forming the package wherein the package provides enhanced thermal dissipation.

It is a yet further advantage of the present invention to provide a hermetically sealed package and process of forming the package wherein a plurality of semiconductor chips are housed and hermetically sealed therein.

It is another advantage of the present invention to provide a hermetically sealed package and process of forming the package wherein the interconnect circuitry, the lead continuity and semiconductor operation can be checked prior to final assembly of the package.

It is yet another advantage of the present invention to provide a hermetically sealed package and process of forming the package wherein two levels of interconnection are provided between a cover with semiconductor devices disposed therein and a multi-layer circuit device to which the cover is hermetically sealed.

It is a still further advantage of the present invention to provide a hermetically sealed package and process of forming the package which is relatively inexpensive to manufacture.

Accordingly, there has been provided a hermetically sealed package adapted to house at least one semiconductor device. The package includes a multi-layer circuit device formed of a plurality of ceramic substrates and conductive circuit patterns disposed therebetween. A ceramic cover having at least one cavity adapted for receiving a semiconductor die is disposed on the multi-layer circuit device. Electrical leads are connected to the semiconductor device and extend outward from the package between the cover and a substrate of the multi-layer circuit device. The cover is glass sealed to the substrate and the electrical leads are sealed therebetween. The leads are electically connected to the conductive circuit pattern within the multi-layer circuit.

The invention and further developments of the invention are now elucidated by means of the preferred embodiment shown in the drawing.

BRIEF DESCRIPTION OF THE DRAWING

Referring to FIG. 1, there is shown a hermetically sealed package 10 adapted to house at least one semiconductor device 12. The package includes a multi-layer circuit assembly 14 which comprises at least first and second ceramic substrates 16 and 18. A conductive circuit pattern 20 is disposed between the first and second substrates 16 and 18. Means 22 bond the first and second ceramic substrates together with the conductive circuit pattern means 20 therebetween. A ceramic cover 24 having at least one cavity 26 therein is adapted for receiving the semiconductor device 12. A first layer of metal foil 28 having electrical leads 30 formed therein is disposed between the cover and the first ceramic substrate. The metal foil is adapted for electrical connection to the semiconductor device 12. A sealing glass 32 seals the first substrate to the cover with the first layer of foil 28 therebetween. The resulting package 10 is adapted to hermetically seal the at least one semiconductor device within said at least one cavity 12. Means 34 electrically interconnect the first layer of metal foil 28 to the conductive circuit pattern means 20 within the multi-layer circuit assembly.

Figure 1:
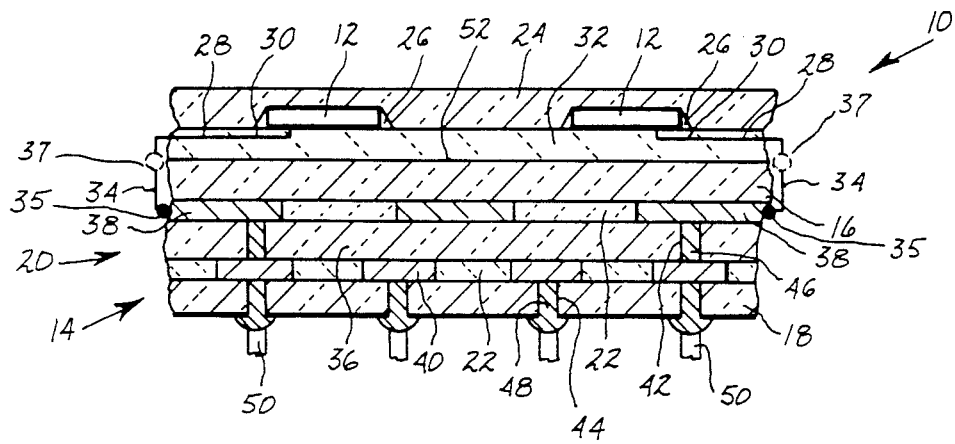
FIG. 1 is a schematic cross-sectional side view of the package of the present invention illustrating the interconnection of the package to the semiconductor devices by the lead tape, interconnect foil layers and vias.

The multi-layer circuit assembly 14 is illustrated with three ceramic substrates 16, 18 and 36. The ceramic substrates as well as the ceramic cover 24 may each be formed from an unfired ceramic sheet (green sheet) which may be constituted of materials including alumina silicate, silicon carbide, zirconia, zircon, berylia, alumina having a purity of about 90 to about 99% and mixtures thereof. Preferably, the ceramic material is a commercial 96% alumina which typically includes about 94.5% $Al_2O_3$ and the remainder including silica, manganese, calcium, and magnesium. It is also within the terms of the present invention to use combinations of the ceramic materials mentioned above or other ceramic materials as desired.

The conductive circuit pattern 20 which is disposed within the multi-layer circuit assembly 14 includes second and third layers of foil 38 and 40 preferably selected from a copper or copper alloy having an electrical conductivity of more than about 60% IACS. This high conductivity copper alloy preferably has alloy additions which make up less than about 10% of the alloy and the remainder being copper. Examples of copper alloys which are thought to be suitable for practicing this invention include CDA 15100, CDA 12200, CDA 10200, and CDA 19400. The selected copper alloy cladding material is preferably a foil, such as one ounce foil, which has been deoxidized. Using a deoxidized copper alloy foil is particularly important to prevent blistering within the foil or at the interface with the bonding glass 22 as will be further described herein.

It is also within the terms of the present invention to select the second and third foils 38 and 40 from an oxygen free copper which is typically an electrolytic copper substantially free form cuprous oxide and produced without the use of residual metallic or metalloidal deoxidizers. Generally, the composition of oxygen free copper is at least 99.95% copper with silver being considered as copper. Examples of oxygen free copper include CDA 10100, CDA 10200, CDA 10400, CDA 10500 and CDA 10700.

The bonding means 22 for bonding the ceramic substrate together with the conductive circuit pattern means therebetween is preferably a bonding glass which forms a flowable mass at a temperature below about 1000° C. The glass is further selected to adhere to both the ceramic substrates and the metallic foil. The glass may be selected from the group consisting of silicate, borosilicate, phosphate and zinc borosilicate glasses. Preferably, the glass selected is a borosilicate glass of a general composition $MO-B_2O_3-SiO_2$, where $MO=$ $BaO$, $CaO$, $ZrO_2$, $Al_2O_3$, $MgO$, $K_2O$, $Na_2O$, $ZnO$, $SrO$, and mixtures thereof. The expansion of the glass can be altered by adjusting the constituents or through the addition of appropriate fillers such as cordierite, beta eucryptite or zirconium silicate. Preferably, the glass will be adjusted to have a coefficient of thermal expansion (CTE) in the range of about $50 \times 10^{-7}$ to about $100 \times 10^{-7}$ in/in/°C. More particularly, the CTE of the glass will be slightly less than the substrate in order that the bonded glass is in compression. For example, with a substrate of alumina, the glass would preferably have a CTE of about $66 \times 10^{-7}$ to about $70 \times 10^{-7}$ in/in/°C. The glass is selected to form a flowable mass within the temperature range from about 500° to about 1000° C. and most preferably from about 600° to about 950° C.

The manufacture of the multi-layer circuit assembly 14 is preferably done in stages where the layers of foil are first bonded to the substrates with glass. For example, a coating of glass is sintered onto a substrate and then a layer of foil is pressed against the glass coating in a reducing or inert atmosphere at a temperature of about 500° to about 1000° C. Another technique of bonding the foil to the substrate is to place a thin, essentially pore-free glass preform between the foil and the substrate. Then, heat and pressure are applied until the glass bonds the foil to the substrate. Each of these techniques is more fully described in U.S. Pat. No. 4,712,161 to Pryor et al.

The electrical conductive circuit patterns may be formed in the layers of copper alloy foil by any desired technique such as photo-etching. This technique generally consists of first coating a surface of the foil with a positive photo-resist which may consist of a light sensitive resin of the photodegradable type. Then, a prescribed patterned mask of material, opaque to exposing light, is placed in contact with the photo-resist. On light exposure, only the unmasked portion of the photo-resist layer gets exposed. The mask is then removed and the resist is developed. The exposed portions of the resist are removed and the circuit patterns formed in the layers of foil in a subsequent etching process. The etching may be accomplished with any conventional solution such as a $FeCl_3/HCl$ copper etchant. The assembly may be coated with photo-resist and etched in this manner several times to produce the desired patterns.

It is also within the terms of the present invention to form the conductive circuitry between the substrates by the conventional technique of silk screening a paste of conductor, glass and a binder in any desired pattern onto the surface of the green ceramic substrates. The resulting assemblies are then fired at about 850° C. to drive off the binder and then to sinter the glass and conductor. As mentioned herein, the fired glass-conductor has a much lower electrical conductivity than that of the solid foil preferably used herein. Also, more precise circuitry can be formed in the solid foil.

In constructing the multi-layer circuit assembly 14, through-holes 44 and 42 are formed through the second and third substrates 18 and 36, respectively. The through-holes may be filled with a conductor such as a conventional conductive paste, a solid conductive wire or plated by techniques such as electroless plating and/or electroplating and filled with a conductor such as solder. A first conductor 46 is disposed within the first through-holes 42 and a second conductor 48 is disposed within the second through-holes 44. A number of different approaches may be taken as to the order and technique of constructing the multi-layer circuit assembly as more fully described in U.S. Pat. No. 4,712,161 which is incorporated by reference herein. Finally, conductor pins 50 are bonded to the conductors 46 and extend outward from the package 10.

A ceramic cover 24 has at least one and preferably a plurality of cavities 26 formed therein for receiving semiconductor dies 12. The dies are bonded to the cover 24 by any conventional technique such as for example with a gold silicon eutectic. By bonding the dies directly to the ceramic cover, the thermal management of the chip is significantly improved over the prior art where the dies were typically bonded to the multi-layer assembly.

A first layer of metal foil or tape 28 is bonded to the die. Preferably, the metal foil is formed as a tape with electrical leads 30 bonded to the semiconductor device and end portions 34 extending outward from the package. A lead pattern of any desired configuration is etched into a relatively thin metal foil or tape to form lead fingers. The tips of the metal lead fingers are bonded to the bonding pads on a semiconductor die. It is also within the terms of the present invention to provide additional tape or foil and to tape automatic bond (TAB) the tape between the tips of the fingers and the bonding pads on the semiconductor device. The ends of the lead fingers, extending outward from the package, form the end portions 34 which are bonded to the conductive circuit pattern means 20 in the multi-layer circuit device. Typically, the electrical leads 30 may be bent external to the package in portion 34 and brazed at point 35 to the circuitry 38 of the multi-layer device. It is also within the terms of the present invention to have both the tape leads 30 and the layer of foil 38 extend external to the package and connect them by conventional brazing techniques, at brazing point 37 (in phantom) such as typically used in side brazed packages. It is also within the terms of the present invention to form the electrical leads 30 into either bumped or unbumped tape as desired and to bond the foil 28 by any desired means, conventional in the art, to the bonding pads on the semiconductor device.

The first layer of metal foil 28 is preferably formed of a metal or alloy which is strongly bondable to glass. Alloys suitable for forming the metal foil include a copper or copper base alloy which has a low oxidation rate an/or is capable of forming a thin refractory oxide layer on at least the surface bonded to the sealing glass. An exemplary alloy capable of forming a refractory oxide layer contains an effective amount of up to about 12% by weight aluminum and the balance copper. Preferably, the alloy consists essentially from about 2% by weight to about 12% by weight aluminum and the balance essentially copper. More preferably, the alloy consists essentially of from about 2 to 10% aluminum, 0.001 to 3% silicon and optionally, a grain refining element selected from the group consisting of iron up to 4.5%, chromium up to 1%, zirconium up to 0.5%, cobalt up to 1% and mixtures of these grain refining elements and the balance copper. In particular, CDA alloy 63800, as disclosed in U.S. Pat. No. 3,676,292 to Pryor et al., has been demonstrated as suitable. Impurities may be present in the alloy which do not significantly degrade the properties of the alloy or prevent bonding in a desired embodiment. CDA 63800 has a coefficient of thermal expansion of about $170 \times 10^{-7}$ in/in/°C.

Another suitable alloy consists essentially from about 1% by weight to about 5% by weight silicon and the balance essentially copper. Preferably, the alloy consists essentially from about 2% by weight to about 4% by weight silicon and the balance essentially copper. Impurities may be present in the alloy which do not significant degrade the properties of the alloy or prevent bonding in a desired embodiment.

The sealing glass 32 is disposed between the cover 24 and the multi-layer device 14 to seal the cover to the substrate 16 and hermetically seal the semiconductor dies within the cavities. The sealing glass composite preferably comprises a low melting point sealing glass selected from the group consisting of lead borate, lead-zinc borate, lead borosilicate or lead-zinc borosilicate glasses. An additive of a particulate filler may be added to decrease the effective coefficient of thermal expansion of the resulting glass composite.

The glass matrix of the sealing glass composite of the invention is preferably a complex lead borate type glass matrix generally also containing one or more other glass components, such as zinc, aluminum, silicon, barium and tin which are normally present in their respective oxide forms. These lead borate type solder glasses usually have a coefficients of thermal expansion of about $80 \times 10^{-7}$ to about $130 \times 10^{-7}$ in/ in/°C. over the temperature range from ambient to their glass transition temperature (typically about 300° C.).

Such glasses are used in forming vitreous seals and glass-ceramic or semicrystalline seals as known in the electronic packaging art. Weight percent compositional ranges are set forth below in Table I where the total content of all oxides is 100 percent.

TABLE I

| Oxide | Broad Range (wt. %) | Preferred Range (wt. %) |
|---|---|---|
| PbO | 70-85 | 75-85 |
| ZnO | 0-20 | 0.5-16 |
| B₂O₃ | 5-15 | 8-15 |
| SiO₂ | 0-10 | 0-5 |
| BaO | 0-3 | 0-2 |
| SnO₂ | 0-5 | 0-2 |

Other conventional glassmaking oxides such as CaO, Bi₂O₃, Na₂O, K₂O, Li₂O, CdO, and Fe₂O₃ can be included. However, it is preferred in many instances not to employ these ingredients but rather to constitute the glass matrix of essentially only those ingredients set forth in Table I above.

In accordance with the present invention, the particulate additive having a lower coefficient of thermal expansion as compared with the glass matrix, are preferably cordierite and beta eucryptite.

An exemplary manner of constructing the semiconductor package is described herein for the purposes of understanding the advantages of the present invention. However, it is also within the terms of the present invention to form package in any convenient manner depending upon the production equipment available.

First, the multi-layer circuit device 14 may be assembled using any of the desired techniques such as those described in U.S. Pat. No. 4,712,161. The electrical continuity of the multi-layer device can then be tested to ensure that the multi-layer device is operating correctly. Next, the semiconductor dies 12 may be bonded within the cavities 26 of the lid 24. The metal foil 28 can then be tab bonded to the bonding pads on the semiconductor dies 12. Preferably, the tab is then electrically tested to ensure that the electrical bonds are sound and that the semiconductor die operates properly. The ability to test prior to final assembly is a significant advantage of the present invention and provides a substantial cost advantage over hermetically sealed packages which are tested subsequent to assembly. Next, the multi-layer circuit assembly 14 has a coating of the sealing glass 32 glazed onto the surface 52 of the first substrate 16. The cover 24 is then placed on the glazed multi-layer circuit assembly and the entire assembly is heated under oxidizing conditions to a sealing temperature of about 400° C. to about 450° C. for about 5 to about 20 minutes. The sealing glass flows around the foil and bonds to both the foil and the cover 24. The package is then allowed to cool and the glass hermetically seals the chips within the cavities. Next, the end portions 34 of the metal foil are bent and brazed to the first layer of metal foil 38 within the multi-layer circuit assembly.

Figure 2:
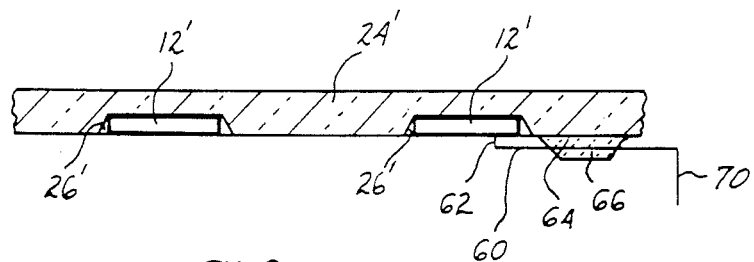
FIG. 2 is a schematic cross-sectional partial side view of the present invention illustrating one layer of interconnection to a semiconductor device bonded to a cover.
Figure 3:
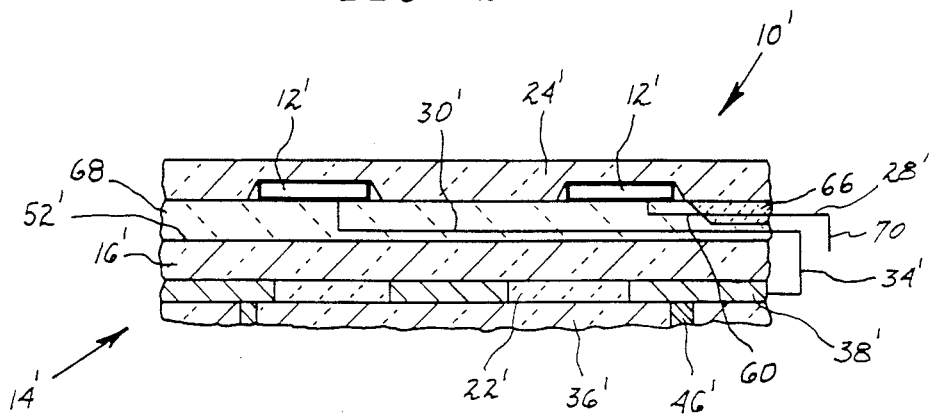
FIG. 3 is a schematic cross-sectional partial side view of the present invention illustrating two layers of interconnection to semiconductor devices disposed between the cover and the multi-layer circuit device.

Referring to FIGS. 2 and 3, there is illustrated a second embodiment incorporating the features of the package of FIG. 1 with the additional advantage of at least a second layer of electrical connection between the cover and the multi-layer circuit device. Primed reference numerals indicate elements which are essentially the same as elements having the same unprimed reference numerals.

As the number of chips disposed in the cavities formed in cover 24 increase, a limiting factor becomes the number interconnections between the chips and the conductive circuit pattern 20 in the multi-layer circuit assembly 14. This number can be significantly increased, and even possibly doubled, by providing a second layer of leads in the space between the cover and the multi-layer circuit device. Further, these additional leads, which extend outwardly from the sides of the hermetic package do not significantly extend beyond the footprint of the package 10 of FIG. 1.

In FIG. 2, there is illustrated a ceramic cover 24' having a plurality of cavities 26' each adapted to receive a semiconductor chip 12'. The chips are bonded to the cover by any conventional technique such as with gold silicon eutectic. A TAB lead frame 60, having either bumped or unbumped lead tips 62, is TAB bonded to the semiconductor die pads. The lead frame is formed of a metal or alloy with a composition as the metal foil or tape 28.

Next, the lead frame 60 which is to be bonded to the inner surface 64 of the cover is placed against the glazed glass 66. A layer of devitrifying solder glass 66 is selectively applied and glazed to the cover 24'. The devitrified glass is typically a lead-zinc-borate solder glass having compositions as exemplified on Table I and which may further include a significant amount of zincoxide. Examples of appropriate glasses are set out in Tables III and IV on pages 178-180 in an article entitled "Solder Glass Processing" by SinghDeo and Shukla, in *Glass Science and Technology*, Volume 2, Academic Press, 1984. An exemplary glass CVIII manufactured by Owen Illinois Corp. has a composition of approximately 10% B, 0.025% Al, 8.5% Si, 0.04% Ti, 0.01% Fe, 8.5% Zn, 12.5% Zr, 0.25% Hf, 2% Ba and the balance Pb. The devitrified glass is heated to a temperature of about 400° to about 500° C. for about 1 to about 30 minutes whereby the glass liquifies and the lead frame is embedded therein. Glass 66 is now in a devitrified or crystallized condition.

As shown in FIG. 3, a metal foil 28' is then TAB bonded to the bonding pads on the desired semiconductor dies. The foil is spaced from the lead frame 60 and insulated therefrom by the glasses 66 and 68. Preferably, the tab foil 28' and the lead frame 60 are then tested to ensure that the electrical bonds are sound, the leads are intact and that the semiconductor dies operate properly. Next, the multi-layer circuit assembly 14' has a coating of vitrifying sealing glass 68 glazed onto the surface 52' of the substrate 16'. Various examples of suitable glass are set out in the SinghDeo et al. article mentioned herein and in Table I herein. Preferably, the glass is a lead-zinc borate solder glass. Typically, the amount of zinc is substantially reduced from that present in the devitrifying glass. The cover 24' is then placed on the glazed multi-layer circuit assembly and the entire assembly is heated under oxidizing conditions to a sealing temperature of about 400° C. to about 450° C. for about 3 to about 30 minutes. The sealing glass bonds to the foil 30' and the lead frame 60, to the cover 24' and to the devitrified glass 66. The devitrified glass being in a crystallized condition prevents the TAB lead frame 60 from dislodging when reheated during the bonding of the cover to the multi-layer circuit device 14'. The package is then allowed to cool and the glass 68 hermetically seals the chips within the cavities. Next, the end portions 34' of the metal foil are bent and brazed to the first layer of metal foil 38' within the multi-layer circuit assembly. Also, the end portion 70 of the tab lead frame is bent as desired.

The patents, patent applications and articles set forth in this application are intended to be incorporated by reference herein.

It is apparent that there has been provided in accordance with this invention a hermetically sealed package which satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternative, modifications and all variations as fall within the spirit and broad scope of the appended claims.

The invention claimed is:

1. A package adapted to house at least one semiconductor device, comprising:
    a multi-layer circuit assembly comprising:
    at least first, second and third ceramic substrates said third ceramic substrate disposed between said first and second ceramic substrates;
    at least first, second and third layers of metal foil; said second and third layers of foil each having a conductive circuit pattern formed thereon and formed from a copper alloy selected from the group consisting of oxygen free copper alloy and deoxidized copper alloy, said second layer of foil being disposed between said first and third substrates and said third layer of foil being disposed between said second and third substrates; and
    means bonding said first and third and said second and third ceramic substrates together with the conductive circuit patterns therebetween;
    a ceramic cover having at least one cavity therein adapted for receiving said at least one semiconductor device;
    the first layer of metal foil having electrical leads formed therein, said first layer of metal foil being disposed between said ceramic cover and said first ceramic substrate, said first layer of metal foil being adapted for electrical connection to the semiconductor device, and said first layer of metal foil having end portions extending outward of said package, said end portions being bonded to said conductive circuitry pattern means; and
    a sealing glass sealing said first substrate to said cover with said first layer of foil sealed therebetween whereby said package is adapted to hermetically seal said at least one semiconductor device within said at least one cavity.

2. The package of claim 1 wherein the bonding means includes:
    a first layer of bonding glass bonding said first and third ceramic substrates and said second layer of foil therebetween; and
    a second layer of bonding glass bonding said second and third ceramic substrates together and said third layer of foil therebetween.

3. The package of claim 2 further including at least a first through-hole extending through said third substrate; and
    a first conductor disposed in said at least a first through-hole for electrically connecting said second and third layers of copper alloy foil.

4. The package of claim 3 further including at least a second through-hole extending through said second substrate; and
    at least a second conductor disposed in said at least a second through-hole for providing an electrical connection from said third layer of foil to an external surface of said package.

5. The package of claim 4 further including at least a first conductor pin bonded to said at least a second conductor, said first conductor pin extending outward from said package.

6. The package of claim 5 further including at least a second cavity in said ceramic cover adapted to receive a second semiconductor device.

7. The package of claim 6 further including first and second semiconductor devices in said first and second cavities, and said first layer of metal foil being connected to said first and second semiconductor devices.

8. The package of claim 1 wherein said sealing glass is selected from the group consisting of lead borate, lead-zinc borate, lead borosilicate and lead-zinc borosilicate glass.

9. The package of claim 8 wherein said sealing glass has a coefficient of thermal expansion between about $60 \times 10^{-7}$ to about $80 \times 10^{-7}$ in/in/°C. which is compatible with the coefficient of thermal expansion of the ceramic cover and the ceramic substrates.

10. The package of claim 9 wherein said first layer of metal foil consists essentially from about 2% by weight to about 12% by weight aluminum and the balance essentially copper.

11. The package of claim 10 wherein said first layer of metal foil consists essentially of about 2% by weight to about 10% by weight aluminum, about 0.001% by weight to about 3% by weight silicon and the balance essentially copper.

12. The package of claim 9 wherein said first layer of metal foil consists essentially from about 1% by weight to about 5% by weight silicon and the balance essentially copper.

13. The package of claim 12 wherein said first layer of metal foil consists essentially from about 2% by weight to about 4% by weight silicon and the balance essentially copper.

14. The package of claim 10 wherein the bonding means is a bonding glass selected from the group consisting of silicate, borosilicate, phosphate and zinc borosilicate glasses.

15. The package of claim 14 wherein the first and second ceramic substrates and said ceramic cover are constructed of a material selected from the group consisting of alumina having a purity of over about 90%, silica, silicon carbide, zirconia, berylia, zircon and mixtures thereof.

16. The package of claim 15 wherein the electrical interconnecting means comprises end portions of said first layer of metal foil extending outward of said package, said end portions being bonded to said conductive circuit pattern names.

17. The process of constructing a package adapted to house at least a first semiconductor device, comprising the steps of:
providing a multi-layer circuit assembly, said multi-layer circuit assembly comprising:
at least first, second and third ceramic substrates;
at least first, second and third metal foil layers;
said second and third layers of foil each having a conductive circuit pattern formed thereon and formed from a copper alloy selected from the group consisting of oxygen free copper alloy and deoxidized copper alloy, said second layer of foil being disposed between said first and third substrates and said third layer of foil being disposed between said second and third substrates; and
means bonding said first and third and said second and third ceramic substrates together with said conductive circuit patterns therebetween;
providing a ceramic cover having at least one cavity therein adapted to receive said at least first semiconductor device;
providing a sealing glass having a coefficient of thermal expansion compatible with that of the substrate and the cover;
disposing at least one semiconductive device within the cavity of said cover and adhering the first semiconductor device thereto;
forming leads within said first layer of metal foil;
disposing said first metal foil layer between said multi-layer circuit assembly and said cover;
bonding the electrical leads of said first layer of metal foil to said semiconductor device;
sealing said cover to said multi-layer circuit assembly with said sealing glass with said first layer of foil sealed therebetween to hermetically seal said at least first semiconductor die within said at least one cavity; and
electrically interconnecting said first layer of metal foil to the conductive circuit patterns within said multi-layer circuit assembly.

18. The process of claim 17 further including the step of selecting said sealing glass from the group consisting of lead borate, lead-zinc borate, lead borosilicate and lead-zinc borosilicate glass.

19. The process of claim 17 wherein the bonding means includes:
a first layer of bonding glass bonding said first and third ceramic substrates and said second layer of foil therebetween; and
a second layer of bonding glass bonding said second and third ceramic substrates together and said third layer of foil therebetween.

20. The process of claim 19 further including the steps of:
providing at least a first through-hole extending through said third substrate; and
disposing a first conductor in said at least a first through-hole for electrically connecting said second layers of copper alloy foil.

21. The process of claim 20 further including the step of selecting said sealing glass having a coefficient of thermal expansion between about $60 \times 10^{-7}$ to about $80 \times 10^{-7}$ in/in/°C. which is compatible with the coefficient of thermal expansion of the ceramic cover and the ceramic substrates.

22. The process of claim 21 including the step of selecting said first layer of metal foil to consist essentially from about 2% by weight to about 12% by weight aluminum and the balance essentially copper.

23. The process of claim 22 including the step of selecting said first layer of metal foil to consist essentially of about 2% by weight to about 10% by weight aluminum, about 0.001% by weight to about 3% by weight silicon and the balance essentially copper.

24. The process of claim 21 wherein said first layer of metal foil consists essentially from about 1% by weight to about 5% by weight silicon and the balance essentially copper 25. The process of claim 24 wherein said first layer of metal foil consists essentially from about 5% by weight to about 4% by weight silicon and the balance essentially copper.

26. The process of claim 22 including the step of selecting the bonding means from a bonding glass from the group consisting of silicate, borosilicate, phosphate and zinc borosilicate glasses.

27. The process of claim 26 including the step of selecting said first, second and third ceramic substrates and said ceramic cover from a material selected from the group consisting of alumina having a purity of over about 90%, silica, silicon carbide, zirconia, berylia, zircon and mixtures thereof.

28. The process of claim 20 further including the steps of:
providing at least a second through-hole extending through said second substrate; and
disposing a second conductor in said at least a second through-hole for providing an electrical connection from said third layer of foil to an external surface of said package.

29. The process of claim 28 further including the steps of bonding a conductor pin to said second conductor pin, said conductor pin extending outward from said package.

30. The process of claim 29 wherein said cover has a second cavity therein with a second semiconductor device therein, and said electrical leads of said first layer of metal foil being bonded to the second semiconductor device.

31. A package adapted to house at least two semiconductor devices, comprising:
   a multi-layer circuit assembly;
   a ceramic cover having at least two cavities therein each adapted for receiving a semiconductor device;
   a lead frame disposed between said ceramic cover and said multi-layer circuit assembly, said lead layer being disposed adjacent said ceramic cover and adapted for electrical connection to one of the semiconductor devices;
   a devitrified solder glass bonding said lead frame to said ceramic cover;
   a first layer of metal foil having electrical leads formed therein, said first layer of metal foil being disposed between said ceramic cover and said multi-layer circuit assembly and adapted for electrical connection to the other of the semiconductor devices said metal foil being electrically isolated from said lead frame, and said first layer of metal foil having end portions extending outward of said package, said end portions being bonded to said multi-layer circuit assembly; and
   a vitrified sealing glass sealing said multi-layer circuit assembly to said cover with said first layer of foil and said lead frame sealed therebetween said vertrified sealing glass electrically isolating said first layer of foil and said lead frames, whereby said package is adapted to hermetically seal said semiconductor devices within said at least two cavities.

32. The package of claim 31 wherein said first layer of metal foil and said lead frame consists essentially from about 2% by weight to about 12% by weight aluminum and the balance essentially copper.

33. The package of claim 31 wherein said first layer of metal foil consists essentially from about 2% by weight to about 4% by weight silicon and the balance essentially copper.

34. The package of claim 31 wherein said cream cover is constructed of a material selected from the group consisting of alumina having a purity of over about 90%, silica, silicon carbide, zirconia, berylia, zircon and mixtures thereof.

35. The process of constructing a package adapted to house at least two semiconductor devices, comprising the steps of:
   providing a multi-layer circuit assembly;
   providing at least two semiconductor devices;
   providing a ceramic cover having at least two cavities therein adapted to receive said at least two semiconductor devices;
   disposing one of said semiconductor devices within each cavity of said cover and adhering the semiconductor devices thereto;
   providing a lead frame having electrical leads;
   providing a devitrified solder glass;
   bonding the electrical leads of said lead frame to one of said semiconductor devices;
   bonding the lead frame to said cover with said devitrified solder glass;
   providing a first layer of metal foil having electrical leads formed therein;
   bonding the electrical leads of said first layer of metal foil to the other of said two semiconductor devices whereby said metal foil is spaced from said lead frame;
   providing a vitrified sealing glass having a coefficient of thermal expansion compatible with that of the multi-layer circuit assembly and the cover;
   sealing said cover to said multi-layer circuit assembly with said vitrified sealing glass with said first layer of foil and said lead frame being spaced apart and sealed therebetween to hermetically seal said at least two semiconductor devices within said package; and
   electrically interconnecting said first layer of metal foil to said multi-layer circuit assembly.

36. The process of claim 35 further including the step of selecting said vitrified sealing glass from the group consisting of lead borate, lead-zinc borate, lead borosilicate and lead-zinc borosilicate glass.

37. The process of claim 36 including the step of selecting said first layer of metal foil and said lead frame to consist essentially from about 2% by weight to about 12% by weight aluminum and the balance essentially copper.

38. The process of claim 36 wherein said first layer of metal foil consists essentially from about 1% by weight to about 5% by weight silicon and the balance essentially copper.

39. The process of claim 36 including the step of selecting said ceramic cover from a material selected from the group consisting of alumina having a purity of over about 90%, silica, silicon carbide, zirconia, berylia, zircon and mixtures thereof.

* * * * *